(12) United States Patent
Yeckel et al.

(10) Patent No.: US 10,212,799 B2
(45) Date of Patent: Feb. 19, 2019

(54) SYSTEM AND METHOD FOR HIGH POWER PULSE GENERATOR

(71) Applicant: Stangenes Industries, Inc., Palo Alto, CA (US)

(72) Inventors: Christopher Yeckel, Palo Alto, CA (US); Richard Cassel, Palo Alto, CA (US)

(73) Assignee: Stangenes Industries, Inc., Palo Alto, CA (US)

( * ) Notice: Subject to any disclaimer, the term of this patent is extended or adjusted under 35 U.S.C. 154(b) by 39 days.

(21) Appl. No.: 15/427,672

(22) Filed: Feb. 8, 2017

(65) Prior Publication Data

US 2017/0236682 A1    Aug. 17, 2017

Related U.S. Application Data

(60) Provisional application No. 62/295,362, filed on Feb. 15, 2016.

(51) Int. Cl.
*H05H 7/02*    (2006.01)
*H03K 3/43*    (2006.01)
(Continued)

(52) U.S. Cl.
CPC ............ *H05H 7/02* (2013.01); *H03K 3/43* (2013.01); *H03K 3/45* (2013.01); *H05H 7/04* (2013.01); *H01J 2237/1504* (2013.01); *H05H 2007/022* (2013.01); *H05H 2007/046* (2013.01); *H05H 2007/048* (2013.01)

(58) Field of Classification Search
CPC ............................ H01J 37/141; H03K 17/567

USPC .... 250/493.1, 492.1–492.3, 396 R, 396 ML; 323/220, 222, 223, 229, 231
See application file for complete search history.

(56) References Cited

U.S. PATENT DOCUMENTS 4,864,213 A * 9/1989 Kido ................. H02M 1/36
                                                         323/222
5,289,108 A * 2/1994 Bourqui .............. H02M 3/1563
                                                         323/222
(Continued)

FOREIGN PATENT DOCUMENTS

WO    2006137822 A3    12/2006
WO    2016193294 A1    12/2016

OTHER PUBLICATIONS

International Search Report and Written Opinion dated May 4, 2018, directed to International Application No. PCT/US2018/016208, 14 pages.

*Primary Examiner* — Michael Maskell
(74) *Attorney, Agent, or Firm* — Morrison & Foerster LLP

(57) ABSTRACT

A device and method for generating pulses to activate and deactivate a kicker magnet is provided. When the kicker magnet is deactivated the circuit generates and stores a magnetic field in an inductor. When the kicker magnet is activated, the circuit changes configuration so that the magnetic field and current stored in the inductor can provide the necessary current to activate the kicker magnet is a minimal amount of time. The configuration of the circuit changes via the use of switches. The switches can employ Zener diodes arranged so as to provide protection against high voltage events and rogue neutrinos that may bombard the switches when the kicker magnet is used in the context of deflecting a particle beam.

26 Claims, 3 Drawing Sheets

(51) Int. Cl.
*H03K 3/45* (2006.01)
*H05H 7/04* (2006.01)

(56) References Cited

U.S. PATENT DOCUMENTS

| | | | | |
|---|---|---|---|---|
| 6,680,603 | B1* | 1/2004 | Klaus-Manfred | H02M 3/158 323/222 |
| 8,957,642 | B2* | 2/2015 | Bramian | H01L 21/8258 323/222 |
| 2007/0139090 | A1* | 6/2007 | Cassel | H02M 3/07 327/181 |
| 2007/0146092 | A1* | 6/2007 | Cassel | H02M 3/07 333/20 |
| 2013/0320953 | A1* | 12/2013 | Cassel | H02M 3/155 323/311 |

* cited by examiner

SYSTEM AND METHOD FOR HIGH POWER PULSE GENERATOR

CROSS-REFERENCE TO RELATED APPLICATION

This application claims priority to U.S. Provisional Application Ser. No. 62/295,362, filed Feb. 15, 2016, titled "SYSTEM AND METHOD FOR HIGH POWER PULSE GENERATOR," which is hereby incorporated by reference in its entirety.

FIELD OF THE DISCLOSURE

This disclosure relates to the generation of high power pulses with a minimal rise time for use in powering devices such as a kicker magnet that require high powered pulses to quickly power a magnet designed to deflect a particle beam away from or towards a target.

BACKGROUND OF THE DISCLOSURE

Directed particle beams can be used in the research, industry, and medical applications to achieve various benefits. As an example, a directed particle beam can be used to ionize cancerous cells thereby changing the characteristics of the cancerous cells and often times hampering the ability of the cancerous cells to proliferate.

As a safety mechanism, an operator controlling the directed particle beam, must be able to terminate or redirect the particle beam away from a target, often times very quickly. One method to terminate the particle beam is to simply turn it off, however the amount of time needed to turn the beam off can be lengthy, and thus may not prove to be an effective method to remove the beam from impinging upon a target in an emergency situation.

Quickly redirecting the particle beam away from a target can be an effective way of immediately stopping the beam from impinging upon the body of the target. High power magnets can be employed to redirect the beam. The magnetic field generated by a high power magnet can cause the beam to change its direction through its interaction with the stream of accelerated particles that make up the particle beam. The magnetic field can be used to deflect the beam away from a target.

In many accelerator applications, requiring a fast-kicker magnet, radiation generated by particle beams, can limit the physical proximity of the modulator to the magnet. Conventionally, the modulator may be located hundreds of feet away from the radiation environment, increasing the complexity and cost of the modulator and cabling.

Powering up the magnet used to the deflect the beam quickly can be critical due to the fact that during the period of time when the magnetic field is building in the kicker magnet, the beam is only being partially deflected and may begin to impinge on unintended surfaces such as the hardware components associated with the particle beam or other surrounding areas. The particle beam should be deflected away from the target as quickly as possible and this can require that the kicker magnet be powered up quickly (i.e., the amount of time that the circuit has a large applied voltage resulting in a fast current rise should be minimized). Furthermore, given the radiation environment that a particle beam and its associated electronics operate in, the application time of a high voltage should be minimized so as to avoid radiation particles damaging the electronics.

Given the amount of current and voltage required to generate a magnetic field with enough of strength to deflect a particle beam, a traditional pulse generator may not be adequate due to the high voltage and currents needed to build the magnetic field. A specialized high power pulse generator, in which the components of the generator can handle the magnitude of current and voltage necessary to operate the kicker magnet, while also generating a pulse with a quick rise time can be necessary to effectively operate a kicker magnet.

SUMMARY OF THE DISCLOSURE

Accordingly, a system and method for generating and delivering a high power pulse to a kicker magnet is provided. The system and method can include a circuit configured to store charge in an inductor during a time period when the kicker magnet is not activated. When the kicker is activated, the circuit can be configured such that the charge stored in an inductor is immediately driven into the kicker magnet. The components of the circuit can include protection features such as Zener diodes that ensure that the circuit does not become negatively impacted from anomalies that can be present in the particle-beam high power environment.

The main susceptibility of pulse generator circuits to radiation-induced failure can be the solid-state switches employed by the circuit that are in an open-state holding off high-voltage. By using an inductively-driven topology to switch DC current flowing through a considerable inductance into the kicker magnet, the time that high-voltage is across the solid-state switch can be minimized and substantially equal to the current rise-time and fall-time in the kicker magnet, thus increasing a mean time to failure (MTTF) of the pulse generator in the radiation environment.

The complexity of the primary energy source can also be reduced to a low-voltage high-current supply that can be located with the controls away from the radiation and linked by high-current DC cabling. This method can allow for an arbitrary pulse width and rep-rate as well as substantially unlimited DC current in the kicker with minimal droop after the initial fast-rise.

DETAILED DESCRIPTION

Described herein are systems and methods for generating high power pulses with fast rise times for use in driving a magnetic load such as that used in a kicker magnet. The systems and methods described herein can be used to ensure that a kicker magnet receives a high powered current pulse with a minimal rise time, when a user of the kicker of the magnet activates the magnet.

The systems and method employ a circuit that includes a first inductor with a large inductance to build up and store a magnetic field during a time period when the kicker magnet is not being operated. When the kicker magnet is activated, the configuration of the circuit is switched so that the energy stored in the first inductor quickly induces a large voltage across the kicker magnet thereby ensuring that the kicker magnet is activated quickly and with a sufficient current and magnetic field to cause the particle beam to deflect.

Figure 1:
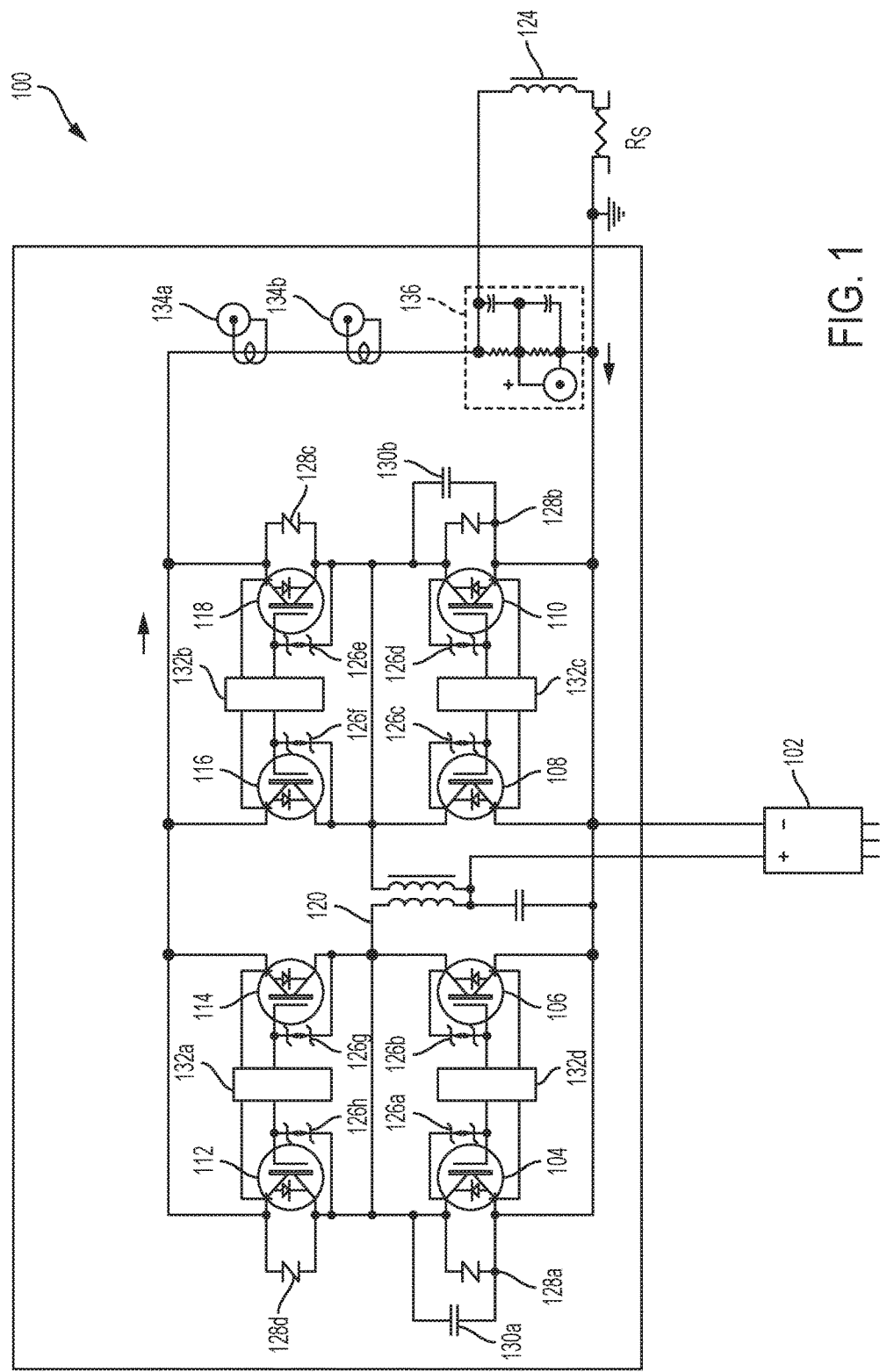
FIG. 1 illustrates an exemplary high power pulse generation circuit according to examples of the disclosure.

FIG. 1 illustrates an exemplary high power pulse generation circuit according to examples of the disclosure. The circuit 100 can be configured to quickly activate a kicker magnet 124. Kicker magnet 124 can be a low impedance electro magnet that can re-direct a particle beam once the magnet is activated. The kicker magnet 124 should be activated quickly due to the fact that while the magnetic field is building up in the kicker magnet (during the time that the current through the kicker magnet is rising), the beam may only be partially deflected and will only be completely deflected once the kicker magnet receives the full amount of current. In the example of a high energy particle beam, a partial deflection can place a large amount of energy (heat or radiation) on a party of the accelerator (i.e., a vacuum tube) that may not be able to handle the increased amount of energy.

In one example, in order to power up quickly, the kicker magnet 124 can require the current flowing through the kicker magnet to increase from 0 amps to 700 in ~one microsecond. Due to this requirement, conventional methods of powering up a device may not be sufficient. As an example, simply connecting the kicker magnet to a power source that can drive 700 amps may not be sufficient due to the fact that such methods usually require one millisecond or longer for the current to ramp up. This can be due to the fact that the inductance in the kicker magnet 124 may require a high voltage to be applied to it in order to obtain a fast current rise-time.

Therefore, circuit 100 can include a system that can drive the kicker magnet 124 with the current it requires at a speed that is required by the system in which the magnet operates. The circuit 100 can be powered by a power source/supply 102 which can generate substantially all of the prime power for the circuit. As an example, the power supply 102 can be configured to generate approximately 12.5 volts at 800 amps so that during operation of the system when the power supply is on, it can be generating the 700 amps required by the kicker magnet 124 can be generated whether or not the kicker magnet has been activated.

The circuit 100 can include two separate sets of switches. The first set of switches 104, 106, 108, 110, can connect the power supply 102 to an inductor 120, during a time period when the kicker magnet has not been activated. Switches 104, 106, 108, and 110 can be implemented as transistors (each having a base, collector, and emitter) that are rated for high power applications. While the circuit 100 is shown as including four separate switches, one of skill in the art would recognize that the number of switches could be more or less, and are dependent on the power and voltage ratings of the switches used to implement circuit 100. In one example, switches 104, 106, 108, 110, 112, 114, 116, and 118 can be implemented as insulated-gate bipolar (IBGT) transistors.

The circuit 100 can include a second set of switches 112, 114, 116, and 118. The second set of switches 112, 114, 108, 110, when activated can connect the power supply 102 and secondary inductor 120 to kicker magnet 124 during a time period with the kicker magnet is activated. Switches 112, 114, 116, and 118 can be implemented as transistors (each having a base, collector, and emitter) that are rated for high power applications. While the circuit 100 is shown as including four separate switches, one of skill in the art would recognize that the number of switches could be more or less, and are dependent on the power and voltage ratings of the switches used to implement circuit 100.

Using the first and second set of switches, the circuit 100 can be operated in two separate configurations that can be mutually exclusive of one another. In one configuration, the circuit 100 can be configured to charge the secondary inductor 120 during a time period when the kicker magnet has not been activated. In another configuration, the circuit 100 can be configured to transfer the charge stored in the secondary inductor 120 into the kicker magnet 124 during a time period when the kicker magnet has been activated.

Figure 2:
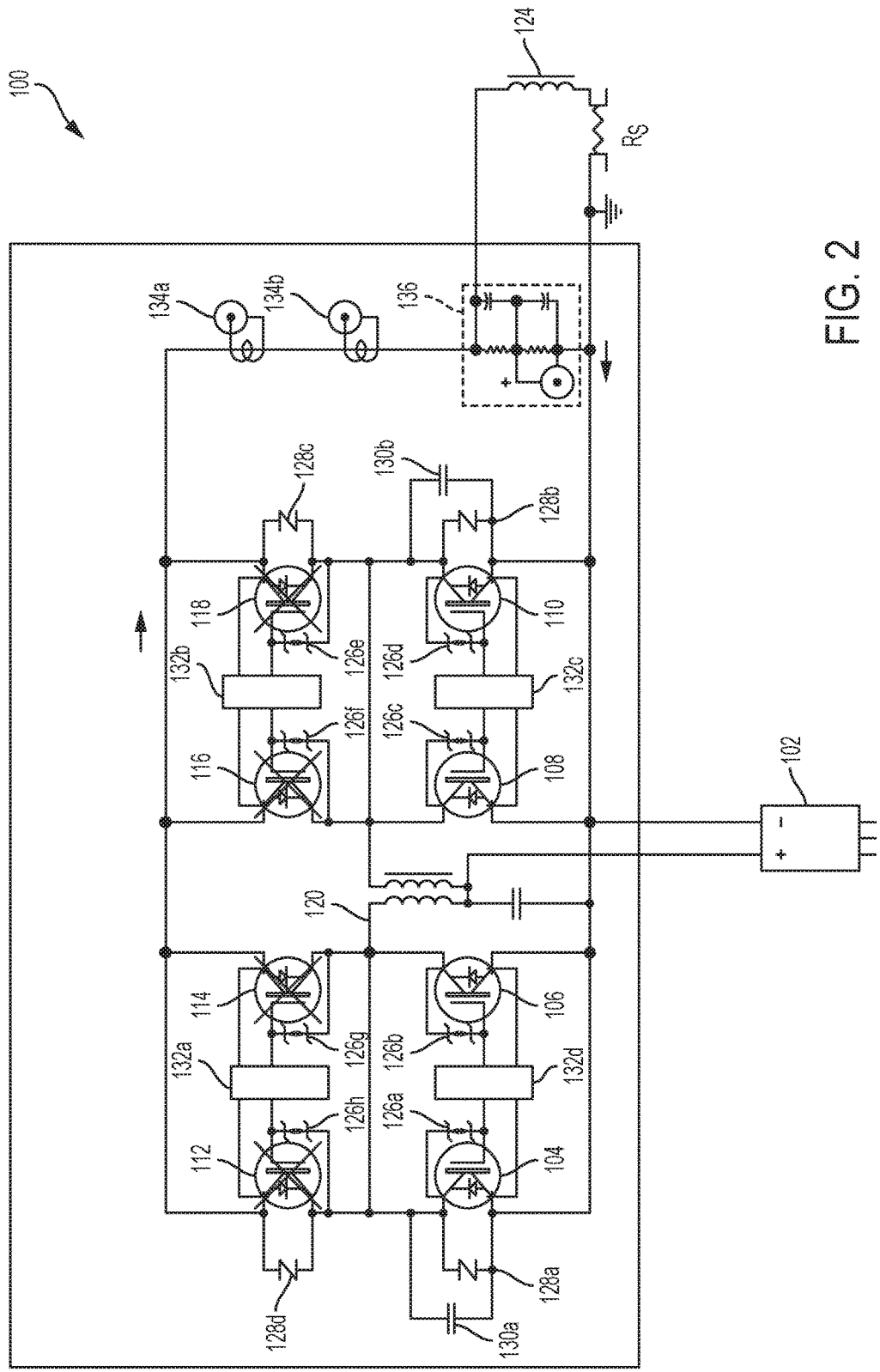
FIG. 2 illustrates an exemplary circuit equivalent of FIG. 1 when the kicker magnet is in an off state according to examples of the disclosure.

FIG. 2 illustrates an exemplary circuit equivalent of FIG. 1 when the kicker magnet is in an off state according to examples of the disclosure. The example of FIG. 2 illustrates the configuration of the circuit 100 of FIG. 1 when the kicker magnet is an off state. When the kicker magnet 124 is in an off state, switches 112, 114, 116, and 118 can be switched off. The switches 112, 114, 116, and 118 can be switched off by applying an appropriate amount of voltage to the gates of the voltage using gate drivers 132a and 132b. The gate drivers 132a and 132b can provide a voltage necessary to cause switches 112, 114, 116, and 118 to not allow current to flow between their respective collectors and emitters. In this way, switches 112, 114, 116, and 118 can be effectively open circuits that do not allow current to pass through the switch. In the example of FIG. 2, switches 112, 114, 116, and 118 are marked with "X"s through them to represent that they are open.

While switches 112, 114, 116, and 118 are open, switches 104, 106, 108, and 110 are closed. Gate voltage drivers 132d and 132c can provide an appropriate voltage to the gates of switches 104, 106, 108, and 110 respectively so as to close the switches, thus providing a path to flow between the collector and the emitter of each switch. By establishing current paths through the switches, the current flowing from the power supply 102 can go through the secondary inductor 120, which can have a large inductance. As an example, secondary inductor 120 can have an inductance of 360 µH. The power supply 102 during this configuration of the circuit 100 can be generating approximately 5 volts at 800 amps. The current generated by the power supply 102 can flow through the secondary inductor 120 and then through the switches 104, 106, 108, and 110 before returning to the power supply 102.

As described, in the configuration illustrated in FIG. 2, the power supply 102 can pump current through secondary inductor 120. The current flowing through secondary inductor 120 can build up a magnetic field in the inductor. The magnetic field can build in the secondary inductor 120 until the circuit reaches a steady state and the magnetic field in the secondary inductor 120 remains constant. This magnetic field can remain in the secondary inductor 120 until the circuit 100 is switched into the second configuration.

Figure 3:
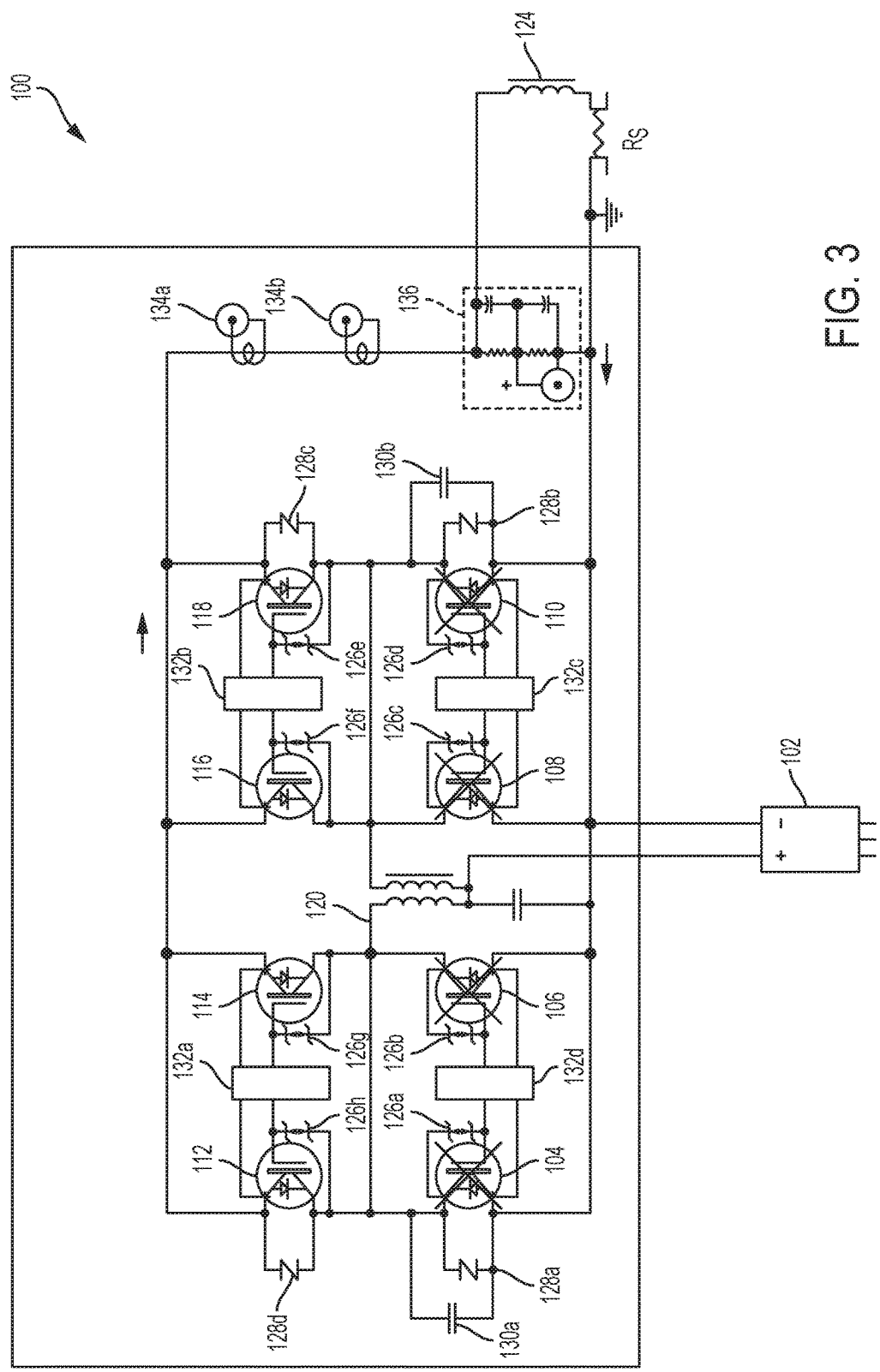
FIG. 3 illustrates an exemplary circuit equivalent of FIG. 2 when the kicker magnet is in an on state according to examples of the disclosure.

FIG. 3 illustrates an exemplary circuit equivalent of FIG. 2 when the kicker magnet is in an on state according to examples of the disclosure. The example of FIG. 2 can illustrate the configuration of the circuit 100 of FIG. 1 when the kicker magnet is activated. When the kicker magnet is activated, switches 112, 114, 116, and 188 can activate (i.e., a voltage can be applied to their respective gates so as to allow current to flow between the collectors and emitters of each switch), while simultaneously switches 104, 106, 108, and 110 can be switched off (i.e., a voltage can be applied to their respective gates so that substantially no current flows between the collectors and emitters of each switch). With switches 104, 106, 108, and 110 switched off, those switches effectively act as open circuits (denoted by the "X"s in the figure), while switches 112, 114, 116, and 118 can provide a new path for the current generated by power supply 102 to flow.

After having built up a magnetic field in secondary inductor 120 when the kicker magnet is not active and the circuit is in the configuration discussed with respect to FIG. 2, by simultaneously activating switches 112, 114, 116, and 118 and deactivating switches 104, 106, 108, and 110, the current flow of the circuit 100 can be rerouted through the active switches and into the kicker magnet 124.

As previously discussed, with respect to FIG. 2 since a 700 amp current was flowing through the secondary inductor in the first configuration, when the configuration of the circuit is changed to the configuration illustrated in FIG. 3, the secondary inductor 120 can resist the change of the flow of the current caused by the changing switches, and can generate any voltage across the inductor so as to resist the change in flow of the current. Taking advantage of this fact, the ratio of inductance between the secondary inductor 120 and the inductance in the kicker magnet 124 can be designed so that the secondary inductor 120 produces enough voltage to push 700 amps into the kicker magnet 124 in ~one microsecond. As mentioned above the secondary inductor 120 can have an inductance value of 360 μH. In order to cause the voltage in the secondary inductor 120 to be high enough when the circuit is switched so as to push 700 amps of current into the kicker magnet 124, the inductance of the kicker magnet can be configured to be approximately 6.5 μH. By setting the ratio between the inductances of the secondary inductor 120 and the kicker magnet 124 accordingly, when the kicker magnet is activated the voltage on the kicker magnet 124 can be approximately 5000V thus making the current flowing through the kicker magnet 124 approximately 700 A. The rise in voltage and the delivery of current can occur within ~a microsecond.

Once the current through the kicker magnet equals 700 A, which can be the same amount of current flowing through the secondary inductor 120, the high voltage across the secondary inductor may no longer be needed to maintain the current flow at 700 A and voltage can fall to a minimal value due to the fact that the resistance of the kicker magnet can be small. Thus after the current rises to the desired value in the kicker magnet, the power supply 102 can provide approximately 700 A through the secondary inductor 120, through switches 112, 114, 116, and 118, through the kicker magnet 124, and then back to the power supply.

When an operator of the circuit wishes to turn the kicker magnet off, switches 112, 114, 116, and 118 can be opened, while switches 104, 106, 108, and 110 can be closed, so that the circuit reverts back to the first configuration described above with respect to FIG. 2, and the secondary inductor 120 begins building up a magnetic field.

By using inductors to drive current rather than using capacitors, the time in which the pulse generator operates at a high voltage can be minimized. In a current driver for a kicker magnet that uses capacitors to store voltage, a capacitor may sit for an indefinite period of time at a high voltage. The voltage can then be transferred through the switch or switches and finally to the kicker magnet. This transfer can generate a high voltage on the kicker magnet that can remain on the kicker magnet for an indefinite amount of time. During this indefinite amount of time, radiation (from the particle beam) may strike the switch due to its proximity to the beam and cause it to erroneously close. This can be especially true since the high voltage across the switch can already be providing pressure for the switch to close. Thus the kicker magnet could potentially be activated without the operator intervention and could cause damage to the system.

By using inductors instead of capacitors to drive the current, rather than storing voltage, the system stores current. This can allow the circuit to only have high voltage present for the ~1 μS it takes for the current to rise and fall in the kicker magnet, thus minimizing the chance for radiation to cause a misfire event in a switch.

When the circuit 100 is switched from the configuration illustrated in FIG. 2, to the configuration illustrated in FIG. 3, the transient high voltage experienced by the circuit can leave the individual components of the circuit to be susceptible to damage. Specifically, the high voltage can cause the switches 104, 106, 108, 110, 112, 114, 116, and 118 to become damaged. In order to provide robust protection to the switches, circuit 100 can employ methods to protect the switches.

Referring back to FIG. 1, each switch 104, 106, 108, 110, 112, 114, 116, and 118 can be configured with a Zener diode 126a-h respectively so as to protect the switch from being damaged by high voltage events. Each Zener diode 126a-h can connect the collector of each switch to its gate. The breakdown voltage of each Zener diode can be selected to make it suitable for the voltages that the switch attached to diode will likely see during operation of the circuit 100. Thus, as an example, the Zener diodes 126e-h which are attached to switches 112, 114, 116, and 118 respectively can be chosen to have a breakdown voltage of approximately 500V. The switches 112, 114, 116, and 118 can be rated for 1200V so as to leave a substantial amount of margin between the overall power rating of the switch and the Zener diode breakdown voltage of the diodes used to protect the switch. Thus, during operation of the circuit, should the voltage across the switches 112, 114, 116, and 118 exceed 500V when the switches are in off state (i.e., the configuration of FIG. 2), the Zener diodes 126e-h can be activated thus turning the gate of each switch back on and causing the switch to conduct. When the switches 112, 114, 116, and 118 are forced to conduct by the Zener diodes 126e-h, the voltage across each switch can collapse/reduce the voltage across it thereby protecting the switch from damage.

The Zener diodes 126a-d associated with switches 104, 106, 108 and 110 can operate in substantially the same way. Switches 104, 106, 108, and 110 can be rated for 6500V while the Zener diodes 126a-d can be chosen to have breakdown voltage of 4 kV thereby providing margin between the rating of the switch and the Zener diode breakdown voltage. In substantially the same manner as discussed above, when the voltage across switches 104, 106, 108, and 110 exceeds 4 kV, the Zener diodes 126a-d can be activated thereby providing a conducting path between the collector and gates of each switch. The conducting path can be used to collapse/reduce the voltage across each switch thereby providing protection for the circuit.

As a secondary means of providing protection to the switches in the circuit 100, each switch 104, 106, 108, 110, 112, 114, 116, and 118 can have a larger Zener diode 128a-d placed across the entire switch. As illustrated in FIG. 1, large Zener diode 128a can be placed across switches 104 and 106, 128b can be placed across switches 108 and 110, 128c can be placed across switches 116 and 118, and 128d can be placed across switches 112 and 114. The large Zener diodes 128a-d can be higher rated than Zener diodes 126a-h. As an example, Zener diodes 128a and 128b can be rated for 5 kV at 700 A while Zener diodes 128c and 128d can be rated at 600V at 700 A. In this way, should Zener diodes 126a-h fail for any reason, the larger Zener diodes can be configured to collapse the voltage across the switch should the need arise.

In addition to the protection mechanisms described above, the circuit 100 can also include dedicated diagnostic hardware. Referring to FIG. 1, the circuit 100 can include current meters 134a and 134b that can measure the current flowing into kicker magnet 124. Circuit 100 can also include a voltage divider circuit 136 that can measure the voltage across kicker voltage 124. These diagnostic instruments can allow for an operator of the circuit 100 to ensure that the kicker magnet 124 is receiving the desired amount of current in the desired amount of time when the kicker magnet is activated.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

What is claimed is:

1. A device for generating current pulses in a kicker magnet, the device comprising:
   one or more first switches:
   wherein when the one or more first switches are activated:
   the device is configured to generate a path for a current to flow from a power supply to an inductor;
   one or more second switches;
   wherein when the one or more second switches are activated:
   the device is configured to generate a path for a current to flow from the inductor to the kicker magnet;
   wherein the device is configured to activate the one or more first switches and deactivate the one or more second switches during a first time period;
   wherein the device is configured active the one or more second switches ad deactivate the one or more first during a second time period; and
   wherein a ratio of an inductance of the inductor and an inductance of the kicker magnet is configured so as to minimize the time in which a current is delivered to the kicker magnet.

2. The device of claim 1, wherein during first time period the kicker magnet is configured to be deactivated.

3. The device of claim 2, wherein during the first time period the device is configured to generate and store a magnetic field in the inductor.

4. The device of claim 3, wherein during the second time period the device is configured to activate the kicker magnet.

5. The device of claim 4, wherein during second time period the device is configured to induce a current in the kicker magnet using the magnetic field generated and stored in the inductor during the first time period.

6. The device of claim 1 comprising:
   one or more first Zener diodes connected to a collector of each switch of the one or more first switches and connected to a gate of each switch of the one or more first switches.

7. The device of claim 6, wherein the first one or more Zener diodes are configured such that a break down voltage of the first one or more Zener diodes is less than a voltage rating of the switch connected to it.

8. The device of claim 7 comprising:
   one or more second Zener diodes connected to a collector of each switch of the one or more first switches and connected to a gate of each switch of the one or more first switches.

9. The device of claim 8, wherein the second one or more Zener diodes are configured such that a break down voltage of the second one or more Zener is less than a voltage rating of the switch connect to it.

10. The device of claim 1 comprising:
    one or more first Zener diodes connected to a collector of each switch of the one or more second switches and connected to a gate of each switch of the one or more second switches.

11. The device of claim 10, wherein the first one or more Zener diodes are configured such that a break down voltage of the first one or more Zener diodes is less than a voltage rating of the switch connected to it.

12. The device of claim 11 comprising:
    one or more second Zener diodes connected to a collector of each switch of the one or more second switches and connected to a gate of each switch of the one or more second switches.

13. The device of claim 12, wherein the second one or more Zener diodes are configured such that a break down voltage of the second one or more Zener is less than a voltage rating of the switch connect to it.

14. A method for generating current pulses in a kicker magnet, the method comprising:
    operating a device in a first configuration, comprising:
    activating one or more first switches, wherein the one or more first switches when active are configured and arranged to provide a path for a current to flow from a power supply, through the one or more first switches, and into an inductor; and
    deactivating one or more second switches,
    wherein activating the one or more first switches and deactivating the one or more second switches occurs during a first time period; and
    operating the device in a second configuration, comprising:
    activating one or more second switches, wherein the one or more second switches when active are configured and arranged to provide a path for a current to flow from the inductor to the kicker magnet;
    deactivating the one or more first switches;
    wherein activating the one or more second switches and deactivating the one or more first switches occurs during a second time period;
    wherein a ratio of an inductance of the inductor and an inductance of the kicker magnet is configured so as to minimize the time in which a current is delivered to the kicker magnet.

15. The method of claim 14, wherein operating the device in the first configuration corresponds to the kicker magnet being deactivated.

16. The method of claim 15, wherein while the circuit is operating in the first configuration, a magnetic field is generated and stored in the inductor.

17. The method of claim 16, wherein operating the device in the second configuration corresponds to the kicker magnet being deactivated.

18. The method of claim 17, wherein while the device is operating in the second configuration, the magnetic field generated and stored in the inductor during the first time period induces a current in the kicker magnet.

19. The method of claim 14, wherein each switch of the one or more first switches has a first one or more Zener diodes connecting a collector of each switch of the one or more first switches to a gate of each switch of the one or more first switches.

20. The method of claim 19, wherein the first one or more Zener diodes have a break down voltage that is less than a voltage rating of the switch of the one or more first switches that it is connected to.

21. The method of claim 20, wherein each switch of the one or more first switches has a second one or more Zener diodes connecting a collector of each switch of the one or more first switches to an emitter of each switch of the one or more first switches.

22. The method of claim 21, wherein a breakdown voltage of the second one or more Zener diodes is greater than the breakdown voltage of the first one or more Zener diodes and is less than a voltage rating of the first one or more switches.

23. The method of claim 22, wherein each switch of the one or more second switches has a third one or more Zener diodes connecting a collector of each switch of the one or more second switches to a gate of each switch of the one or more second switches.

24. The method of claim 23, wherein the third one or more Zener diodes have a break down voltage that is less than a voltage rating of the switch of the one or more second switches that it is connected to.

25. The method of claim 24, wherein each switch of the one or more second switches has a fourth one or more Zener diodes connecting a collector of each switch of the one or more second switches to an emitter of each switch of the one or more second switches.

26. The method of claim 25, wherein a breakdown voltage of the fourth one or more Zener diodes is greater than the breakdown voltage of the third one or more Zener diodes and is less than a voltage rating of the second one or more switches.

* * * * *